United States Patent [19]
Carey et al.

[11] Patent Number: 5,219,787
[45] Date of Patent: Jun. 15, 1993

[54] TRENCHING TECHNIQUES FOR FORMING CHANNELS, VIAS AND COMPONENTS IN SUBSTRATES

[75] Inventors: David H. Carey, Austin, Tex.; Douglass A. Pietila, Puyallup, Wash.; David M. Sigmond, Austin, Tex.

[73] Assignee: Microelectronics and Computer Technology Corporation, Austin, Tex.

[21] Appl. No.: 840,428

[22] Filed: Feb. 24, 1992

Related U.S. Application Data

[63] Continuation-in-part of Ser. No. 557,427, Jul. 23, 1990, Pat. No. 5,091,339.

[51] Int. Cl.$^5$ .................... H01L 21/283; H01L 21/306
[52] U.S. Cl. ........................ 437/187; 437/192; 437/194; 437/228; 437/229; 437/238; 437/944
[58] Field of Search .............. 437/187, 192, 194, 225, 437/228, 229, 235, 238, 203, 944; 148/DIG. 100

[56] References Cited

U.S. PATENT DOCUMENTS

| | | | |
|---|---|---|---|
| 3,904,454 | 9/1975 | Magdo et al. | 437/235 |
| 3,961,414 | 6/1976 | Humphreys | 437/238 |
| 4,249,196 | 2/1981 | Durney et al. | 357/74 |
| 4,451,854 | 5/1984 | Philofsky et al. | 357/72 |
| 4,453,176 | 6/1984 | Chance et al. | 357/51 |
| 4,453,199 | 6/1984 | Ritchie et al. | 361/306 |
| 4,454,529 | 6/1984 | Philofsky et al. | 357/75 |
| 4,527,185 | 7/1985 | Philofsky et al. | 357/70 |
| 4,639,826 | 1/1987 | Val et al. | 361/272 |
| 4,654,689 | 3/1987 | Fugii | 357/51 |
| 4,654,694 | 3/1987 | Val | 357/74 |
| 4,680,613 | 7/1987 | Daniels et al. | 357/72 |
| 4,714,952 | 12/1987 | Takekawa et al. | 357/51 |
| 4,737,838 | 4/1988 | Watanabe | 357/51 |
| 4,764,484 | 8/1988 | Me | 437/192 |
| 4,816,894 | 3/1989 | Hattori | 357/51 |
| 4,999,318 | 3/1991 | Takahumi et al. | 437/194 |
| 5,030,589 | 7/1991 | Nada | 148/DIG. 100 |
| 5,055,426 | 10/1991 | Manning | 437/192 |
| 5,068,207 | 11/1991 | Manocha et al. | 437/944 |
| 5,104,828 | 4/1992 | Morimoto et al. | 437/235 |

FOREIGN PATENT DOCUMENTS

| | | | |
|---|---|---|---|
| 0045877 | 7/1981 | European Pat. Off. | |
| 0224013 | 6/1987 | European Pat. Off. | |
| 58-52816 | 3/1983 | Japan | 437/194 |
| 59-66125 | 4/1984 | Japan | 437/238 |
| 59-195824 | 11/1984 | Japan | |
| 61-102755 | 5/1986 | Japan | |
| 61-187236 | 8/1986 | Japan | |
| 2-72632 | 3/1990 | Japan | |
| 2-213144 | 8/1990 | Japan | |
| 2096821 | 3/1982 | United Kingdom | |

OTHER PUBLICATIONS

R. S. Bennett et al, "Selective Planarization Press and Structures", *IBM Technical Disclosure Bulletin*, vol. 27, No. 4B, pp. 2560-2563, Sep., 1984.

Tsuneo Hamaguchi, "Hydrostaic Float Polishing for Wafer Preparation", *Rev. Sci. Instrum.*, vol. 55, No. 11, pp. 1867-1868, Nov. 1984.

Iwasaki et al., "A Pillar Shaped Via Structure in a Cu-Polyimide Multilayer Substrate", IEEE/CHMT '89 Japan IEMT Symposium, pp. 128-131, 1989.

Hamaguchi, "Hydrostatic Float Polishing for Wafer Preparation", Rev. Sci. Instrum. vol. 55, No. 11, Nov. 1984, pp. 1867-1868.

C. W. Koburger, "Trench Planarization Technique", *IBM Technique Disclosure Bulletin*, vol. 27, No. 6, pp. 3242-3243, Nov. 1984.

(List continued on next page.)

*Primary Examiner*—Olik Chaudhuri
*Assistant Examiner*—Ourmard S. Ojan
*Attorney, Agent, or Firm*—David M. Sigmond

[57] ABSTRACT

Trenching techniques for forming a channel partially through and a via completely through the insulating layer of a substrate are disclosed. With additional steps the channel can form an electrically conductive line, an electrode of an integrated capacitor, or an optical waveguide.

33 Claims, 8 Drawing Sheets

OTHER PUBLICATIONS

David B. Tuckerman, et. al., "Pulsed Laser Planarization of Metal Films for Multilevel Interconnects" *V—MIC Conference Paper*, pp. 24-31, Jun. 25-26, 1985.

L. B. Rothman, et. al., "Lift-Off Process to Form Planar Metal/Sputtered SiO2 Structures", *V-MIC Conference Paper*, pp. 131-137, Jun. 25-26, 1985.

W. E. Mutter, "Choic Stop Material for Chemical/Mechanical Polish Planarization", *IBM Technical Disclosure Bulletin*, vol. 27, No. 8, p. 4642, Jan. 1985.

K. D. Beyer, et. al., "Glass Planarization by Stop-Layer Polishing", *IBM Technical Disclosure Bulletin*, vol. 27, No. 8, pp. 4700-4701, Jan. 1985.

Unknown author, "Chemical Vapor Deposited Device Isolation with Chemical/Mechanical Planarization", *IBM Technical Disclosure Bulletin*, vol. 29, No. 2, pp. 577-579, Jul. 1986.

K. K. Chakrovorty, et. al., "Photosensitive Polyimide as a Dielectric in High Density Thin Film Copper-Polyimide Interconnect Structures", *Electrochemical Society Meeting Paper*, vol. 88, No. 1, pp. 77-78, May 15-20, 1988.

Elito K. Broadbent, et. al., "High-Density High-Reliability Tungsten Interconnection by Filled Interconnect Groove Metallization", *IEEE Transactions on Electron Devices*, vol. 35, No. 7, pp. 952-956 (Jul. 1988).

Paul E. Riley, et. al. "Planarization of Dielectric Layers for Multilevel Metallization", *IEEE Transactions on Semiconductor Manufacturing*, vol. 1, No. 4, pp. 154-156, Nov. 1988.

Robert J. Contolini, et. al., "Embedded Conductors by Electrochemical Planarization", *Lawrence Livermore National Laboratory Preprint*, Apr. 1989.

Carter W. Kaanta, et. al., "Dual Damascene: A ULSI Wiring Technology", *V-MIC Conference Paper*, pp. 144-152, Jun. 11-12, 1991.

C. H. Ting, "Electroless Deposition for Integrated Circuit Fabrication", *Electrochemical Society Fall Meeting—Honolulu, Hawaii*, vol. 87-2, p. 720, Oct. 18 and 23, 1987.

Pei-lin Pai, "A Planarized Metallization Process Using Selective Electroless Deposition and Spin-On Glass", *Electrochemical Society Fall Meeting-Honolulu, Hawaii*, vol. 87-2, p. 678, Oct. 18 through 23, 1987.

Andy L. Wu, "Prarie-A New Planarization Technique and its Application in VLSI Multilevel Interconnection", *Proceedings of Electrochemical Society Symposium on Multi-Level Metallization, Interconnection, and Contact Technologies*, pp. 239-249, Oct. 21 through 22, 1986.

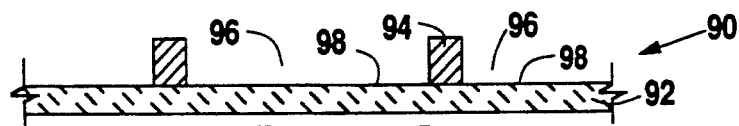
Fig. 16
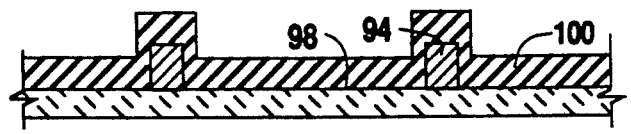
Fig. 17
Fig. 18
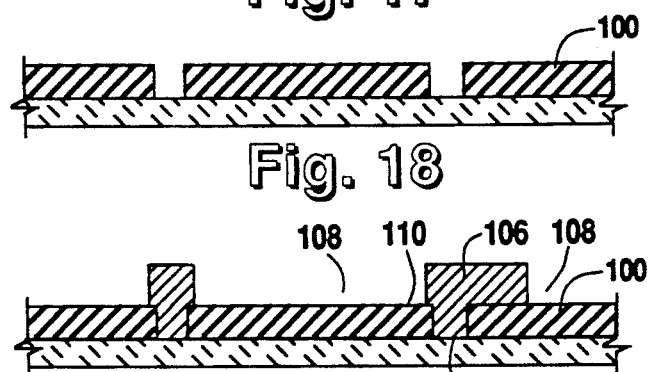
Fig. 19
Fig. 20
Fig. 21
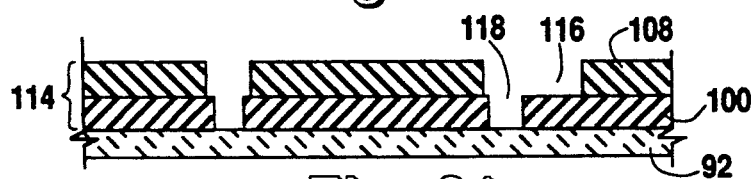
Fig. 22
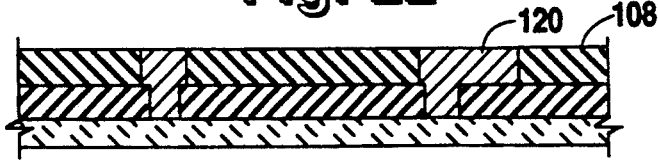
Fig. 23

TRENCHING TECHNIQUES FOR FORMING CHANNELS, VIAS AND COMPONENTS IN SUBSTRATES

CROSS-REFERENCE TO RELATED APPLICATIONS

This is a continuation-in-part of U.S. Ser. No. 07/557,427 filed Jul. 23, 1990, now U.S. Pat. No. 5,091,339.

BACKGROUND

1. Field of the Invention

The present invention is directed to trenching techniques for forming channels and vias in substrates, and more particularly to methods for fabricating channels and vias in the insulating layer of a substrate, and using the channels as conductive lines, electrodes of integrated capacitors, and/or optical waveguides.

2. Description of the Related Art

High density copper/polyimide interconnect substrates can be fabricated by providing conductors on a base, building interlayer pillars on the conductors, and coating the conductor-pillar structure with polyimide. This has several drawbacks: the metal conductor-pillar structure is vulnerable to mechanical damage before polyimide encapsulation; resist scumming can develop on underlying patterned layers after wet chemical etching; particles on the surface prior to plating can plate up quickly causing interlayer short circuits; and cooling after the 400° C. polyimide cure can create stress between the copper and polyimide since copper has a different thermal coefficient of expansion.

These drawbacks associated with conductor-pillar structures can be overcome by forming trenches for vias and channels in a polyimide layer and then filling the trenches with a conductor. One such method for fabricating high density electronic circuits having narrow conductors is disclosed by Becker in U.S. Pat. No. 4,417,393. However, drawbacks to Becker's method include the need for laser machining and the inability to incorporate electrodeposition.

Furthermore, current interconnect fabrication methods with relatively few steps form conductive channels and vias simultaneously but fail to provide via stacking. Alternative methods which provide via stacking require a relatively large number of process steps.

SUMMARY OF THE INVENTION

The present invention provides trenching techniques for fabricating substrates by forming the channels and vias using well known low cost processes such as etching, plating and polishing in relatively few steps while retaining design flexibility. Substrates suitable for the present invention include multilevel electrical interconnects, high density multichip modules, printed circuit boards, printed wiring boards, thin film interconnects, planar integrated circuit interconnects, multilevel integrated circuit wiring and the like.

An object of the present invention is to form channels and vias in the insulating layer of a substrate as well as filling the channels and vias with a conductor with relatively few and simple process steps.

Still another object of the present invention is to deposit the conductor into the channels and vias simultaneously as well as to provide via stacking.

Another object of the present invention is to minimize yield loss mechanisms that often accompany multilayer substrate assembly, such as pinholes and mechanical weakness.

A feature of the present invention is the use of the channel as an electrically conductive line, an electrode of an integrated capacitor, or an optical waveguide.

Further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIGS. 16–23 and 18A–18D are cross-sectional views detailing another method of forming a conductive channel and via in the insulating layer of a substrate in accordance with a second embodiment of the invention;

DETAILED DESCRIPTION OF THE PREFERRED EMBODIMENTS

Various techniques for forming conductive channels and vias in multilevel electrical interconnects are described in U.S. Pat. No. 5,091,339 by Carey entitled "Trenching Techniques For Forming Vias And Channels In Multilevel Electrical Interconnects" which is the parent of for the present invention, assigned to the assignee of the present invention and incorporated herein by reference.

The present invention expands on the teachings of the '427 application. The first and second embodiments describe additional methods of forming a channel and via in the insulating layer of a substrate, the insulating layer requiring first and second patterned insulating layers. The third embodiment is directed to a method of forming an integrated capacitor in a substrate whereby a channel and via in the insulating layer provide an electrode for the capacitor. The fourth embodiment is directed to a method of forming an optical waveguide in a channel of the insulating layer of a substrate.

FIRST EMBODIMENT

Referring now to FIGS. 1–15, a first embodiment for forming an electrically conductive channel and via in the insulating layer of a substrate is shown.

Figure 1:
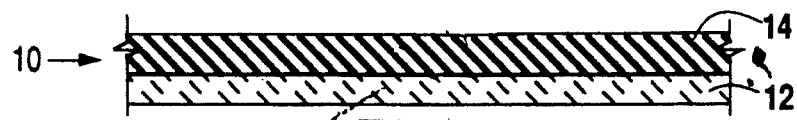
FIGS. 1–15, 10A and 10B are cross-sectional views detailing a forming a conductive channel and via in the insulating layer of a substrate in accordance with a first embodiment of the invention.

In FIG. 1, a high density electronic interconnect substrate designated as 10 is fabricated on a base 12. Base 12 is shown as a ceramic such as alumina ceramic or glass ceramic, however, it is understood that base 12 can be an organic or inorganic insulator, a conductor, an integrated circuit, or a preceding layer if the interconnect is a multilevel structure. Base 12 may require appropriate surface preparation, such as polishing, cleaning, etching, or roughening to assure acceptable contamination removal, adhesion and/or surface finish. For example, it may be advantageous to roughen a copper/polyimide base by plasma etching, or to smoothen a ceramic, plastic, or metal base by polishing. A first insulating layer shown as a layer of uncured Ultradel 4212 polyimide 14 is deposited on base 12. Polyimide 14 is then subjected to a hot plate bake to drive out solvents and stabilize the film.

Figure 2:
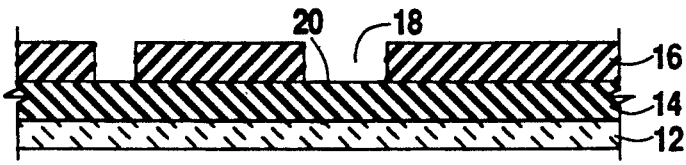

In FIG. 2, a first mask is provided over the first insulating layer in order to expose a portion of the first insulating layer and define the via. For instance, a layer of photoresist 16 is deposited on polyimide 14 and conventionally patterned such that opening 18 exposes portion 20 of polyimide 14 at the via.

Figure 3:
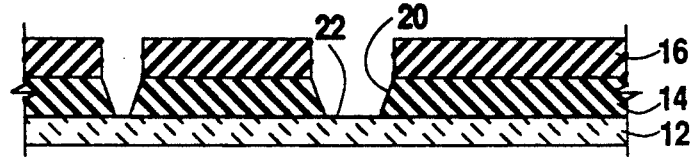

In FIG. 3, the portion of the first insulating layer in the via is removed and the base beneath the via is exposed. As may be seen, a conventional wet chemical etch is applied which removes the exposed portion 20 of polyimide 14 and thus exposes surface portion 22 of base 12.

Figure 4:

In FIG. 4, the first mask is removed. Photoresist 16 can be stripped by a suitable wet chemical etch such as Ultradel S930D for 10 minutes. A spin rinse may be used to remove residual contaminants. Next, polyimide layer 14 is cured at 350° C. for one hour to form a 6 micron thick hardened layer.

Figure 5:
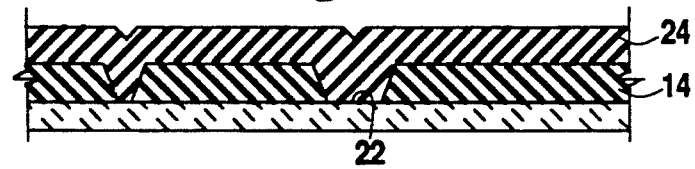

In FIG. 5, a second insulating layer is deposited on the first insulating layer and the exposed portions of the base. For example, a layer of uncured polyimide 24 is coated on polyimide 14 and exposed base portion 22, and thereafter baked and stabilized.

Figure 6:
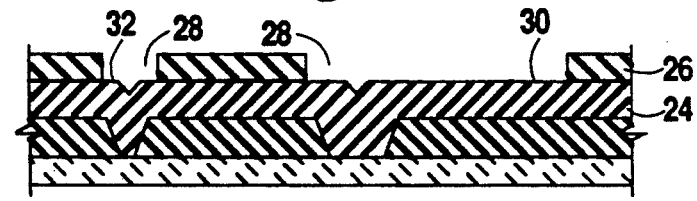

In FIG. 6, a second mask is provided over the second insulating layer in order to expose a portion of the second insulating layer and define the channel and the via. For instance, another layer of photoresist 26 is applied on polyimide 24 and patterned so that openings 28 expose polyimide 24 at portion 30 corresponding to the channel and portion 32 corresponding to the via.

Figure 7:
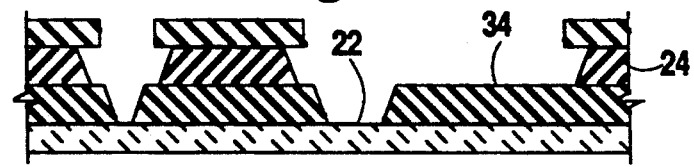

In FIG. 7, the portion of the second insulating layer in the channel and via is removed, thereby exposing the first insulating layer beneath the channel and the previously exposed portion of the base beneath the via. In the example, a second wet chemical etch is applied which removes exposed portions 30 and 32 of polyimide 24 and thereby exposes portion 34 of polyimide 14 beneath the via and previously exposed portion 22 of base 12, respectively. Base 12 and cured polyimide layer 14, however, are not affected by the second wet chemical etch.

Figure 8:
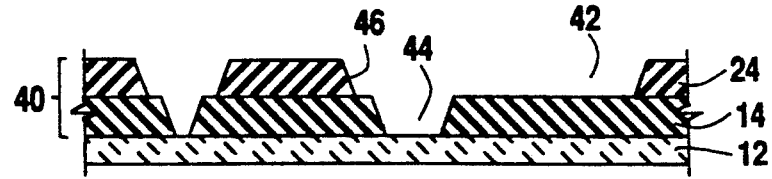

In FIG. 8, the second mask is removed, for instance by etching photoresist 26, and polyimide 24 is cured to form a 6 micron thick layer. As a result, insulating layers 14 and 24 provide an insulating layer 40 on base 12. Layer 40 includes a horizontal channel 42 and, adjacent to channel 42, a vertical via 44. Channel 42 has a 6 micron depth, the thickness of the cured second insulating layer. Likewise, via 44 has a 12 micron depth, determined by the combined thickness of the cured first and second insulating layers. The design choice of a 6 micron deep channel in a 12 micron thick insulating layer is a compromise between the Scylla and Charybdis of high line resistance from too thin a channel and low characteristic impedance (i.e. capacitive loading) from too thick a channel. Furthermore, via sidewalls 46 preferably are tilted at a 70° angle converging toward base 12 to improve fabrication of additional materials thereon. The via sidewall angle, however, is a trade-off between denser vias from more vertical sidewall slopes and improved step coverage vias from less vertical sidewall slopes. In any case, after channel 42 and via 44 are formed substrate 10 may require surface cleaning if contamination develops from etch products not carried away by the etch process.

Various other materials are well suited for the present invention. For instance, The masks may be silicon-dioxide, silicon-nitrides or even a metal; the insulating layers may be polymers, silicon-dioxide, nitrides, oxynitrides, spin on glasses, or solgels. Alternatively, the insulating layers can be a photoimagible polymer. The use of photoimagible polyimide is conventional, see, for instance, K. K. Chakravorty et al, "Photosensitive Polyimide as a Dielectric in High Density Thin Film Copper-Polyimide Interconnect Structures," *The Electrochemical Society Extended Abstracts,* Vol. 88-1, Abstract No. 54, pp. 77–78 (May, 1988). For example, an uncured photoimagible polyimide insulating layer can be selectively exposed to a mercury light through a mask spaced from the polyimide in order to selectively alter the solubility of the exposed polyimide. Preferably, a negative process is used. That is, the exposed polyimide is rendered insoluble from the light whereas the unexposed (non-irradiated) polyimide remains soluble. After applying the light, removing (i.e., drawing away) the mask, and removing the soluble polyimide from the substrate, a soft bake can be applied to render the insoluble polyimide harder for further processing. A brief descumming etch may also be desirable. A photoimagible polymer can be used for the first insulating layer, the second insulating layer, or both. For instance, the first insulating layer may be photoimagible polyimide patterned by exposure to a light source whereas the second insulating layer can be conventional polyimide patterned by exposure to a wet chemical etch.

Other well-known etching techniques can also be used to remove the first insulating layer from the via and the second insulating layer from the channel and via. A dry would be best suited for forming vertical via sidewalls. On the other hand, a wet chemical etch is normally more isotropic than a dry etch thereby facilitating a slope on the via sidewalls, although the wet etch may lead to a via sidewall slope which is too large and/or a wet etch may not have sufficient accuracy for fine pitch geometries. Nonetheless, a wet etch is normally preferred since it can readily etch an insulating layer without attacking a soft mask, such as photoresist, which might erode or otherwise dissolve in the presence of a dry etch.

Another suitable etching technique is photoablation, or light based etching. The use of an excimer laser to remove selected regions of materials by photoablation in order to pattern the underlying layer is well known in the art. This is termed "ablative photodecomposition" (APD) and requires high powered pulsed sources. U.S. Pat. No. 4,414,059 describes an APD process in which ultraviolet radiation of wavelengths less than 220 nm cause fragmentation of resist polymer chains and the immediate escape of the fragmented portions from the resist layer. In effect the incident energy is transferred to kinetic energy in rapid and large amounts of bond breaking whereby the polymer chains are fragmented and explode-off as volatile by-products. This is a "positive" process since after the substrate is flooded with light the exposed regions of the polyimide as well as a soft mask will etch. The use of ultraviolet radiation particularly for APD and etching of polyimide is known in the art. U.S. Pat. No. 4,508,749 to Brannon et al. describes the use a of U.V. source between 240–400 nm to etch through a polyimide layer. Brannon et al. is primarily directed to producing tapered openings in the polyimide structure between metallization layers so that metallization can then be deposited in the openings to connect metallic layers adjacent to the top and bottom surfaces of the polyimide.

After the channel and via are formed in the insulating layer there are many ways of depositing an electrical conductor therein, including electrolytic deposition, electroless deposition, evaporation, sputtering, and squeegeeing. Several such ways shall be described. Unless otherwise noted, for illustration purposes electrolytic deposition shall be used.

Figure 9:
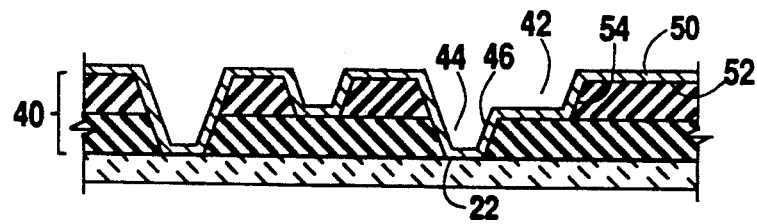

Referring now to FIG. 9, after channel 42 and via 44 are formed in polyimide layer 40, seed layer 50 of 2500 angstroms copper over 700 angstroms chrome is sputter deposited over top surface 52 of polyimide layer 40, walls 54 of channel 42, sidewalls 46 of via 44, and exposed base portions 22 beneath vias 44. That is, seed layer 50 covers the entire surface of substrate 10 to provide adhesion for subsequent electrolytic deposition of an electrical conductor. While seed layer 50 will provide a more uniform coverage of via sidewalls 46 when they are sloped, should via sidewalls 46 be vertical then sputtered seed layer 50 would be thinner but still of sufficient thickness.

Figure 10:
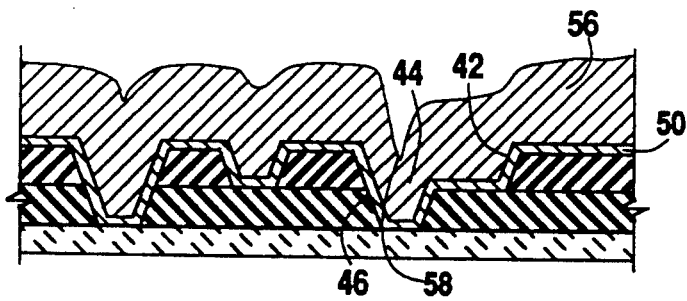

In FIG. 10, an electrical conductor such as copper 56 is electrolytically deposited over the entire seed layer 50 so that the copper 56 substantially, and preferably completely, fills channel 42 and via 44. More preferably, copper 56 in via 44 abuts above the top of polyimide layer 40 since a copper valley 58 may quite possibly form inside via 44. In this example, polyimide insulating layer 40 (and, thus initially, via 44) is 12 microns thick and seed layer 50 is very thin. Therefore, copper 56 fills via 44 and forms a 12 micron thick layer on top of polyimide 40. If copper 56 is thicker than 12 microns, additional planarization will be required to remove the excess copper from the substrate, as shall be described below. On the other hand, if copper 56 is thinner than 12 microns then via 44 may not be entirely filled. Nevertheless, copper 56 should substantially fill via 44, such as by completely covering via sidewalls 46 despite pit 58 to ensure proper electrical interconnection between the copper 56 in channel 42 and in via 44, as well as between the copper 56 in via 44 and an overlaying conductor. During electrodeposition, high current densities at the top edges of the trenches may cause ridge build-up of the conductive material thereon which blocks the conductive material from filling the trenches. In this case, reverse pulse plating can be used during electrodeposition to continually shave back ridge build-ups. Leveling agents in the plating bath can also prevent ridge build-ups.

Figure 9A:
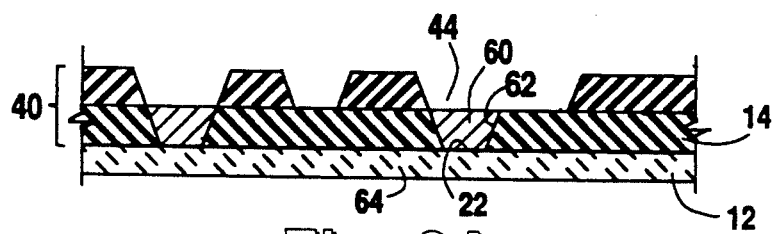
Figure 10A:
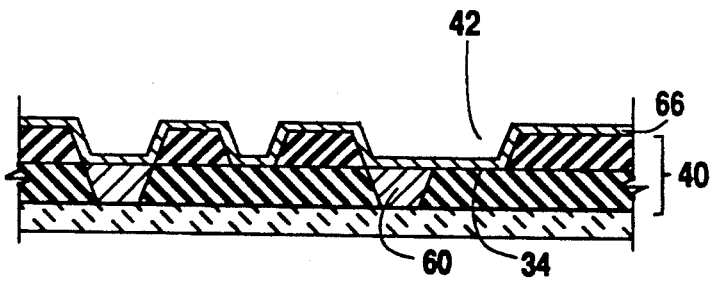
Figure 10B:
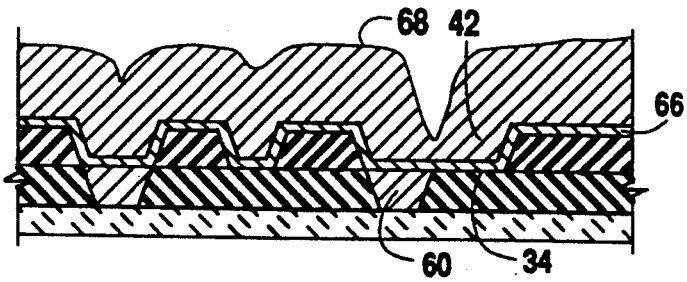

In FIGS. 9a, 10a and 10b another method for depositing an electrical conductor in the channel and via is shown. As seen in FIG. 9a, a first electrical conductor, such as copper 60 is plated, preferably by electroless deposition, into the lower via region 62 in lower insulating layer 14. In this example, base 12 is an electrical conductor and the exposed base surface 22 beneath via 44 provides a first seed layer 64 for copper 60. In FIG. 10a, a second seed layer 66, which may be similar to seed layer 50, is sputtered over the top of copper 60 and the bottom 34 of channel 42. In FIG. 10b, a second electrically conductive layer, shown as copper 68, is electrolytically deposited on second seed layer 66. It is noted that since the lower via region 62 is already filled with copper 60, it is only necessary to deposit 6 microns of copper 68 in order to completely fill channel 42 and via 44 with copper. This is advantageous since only 6 (instead of 12) microns of copper need be removed from the top surface of insulating layer 40.

Alternatively, copper conductors 56, 60 and 68 can be deposited by other processes such as evaporation or sputtering which may obviate the need for seed layers 50, 64 and 66, respectively. While evaporation is faster than sputtering, sputtering may be preferred for thin metallization, for instance if the vias and channels are formed in an integrated circuit.

Another way of depositing a conductor in the channel and the via is by electroless deposition (not shown). The insulating layer must first be treated to be receptive to an electroless plating bath. U.S. Pat. No. 4,701,351 by Jackson discloses a seeding process for electroless metal deposition in which a substrate is coated with a thin (1 micron) layer of a polymer which complexes with a noble metal compound, and the layer of polymer is contacted with a noble metal compound to form a complexed polymer. Thereafter the substrate is placed in an electroless plating bath. A mask can be used to expose selected regions of the polymer to the noble metal compound and/or electroless plating bath. After electroless deposition the substrate surface is planarized such as by polishing. An advantage of electroless deposition is that the pre-deposition treatment layer need not be a conductor. A disadvantage of the predeposition polymer treatment in Jackson is that the polymer seed layer does not typically adhere to the substrate as well as a sputtered conductor seed layer. As compared to electrolytic deposition, electroless deposition tends to provide more uniform coverage but the process takes more time.

Still another method (not shown) of filling the channel and via with a conductor is by squeegeeing across the surface a liquid metal or metal paste, such as disclosed in U.S. Pat. No. 5,056,706 to Dolbear et al. After squeegeeing the liquid metal may stay clear of the polyimide surface. In the likely event excess liquid metal remains on the substrate surface it must be removed, as by lightly lapping the substrate surface to assure a planarized and non-short-circuited substrate top surface. A disadvantage of squeegeeing is that liquid metals are not as conductive as, say, copper, and thereby may seriously degrade the performance of high density substrates with fine line pitches.

The final step of the present invention is planarizing the top of the substrate until the electrical conductor remains only in the channel and the via and the substrate top surface is substantially smooth.

Figure 11:
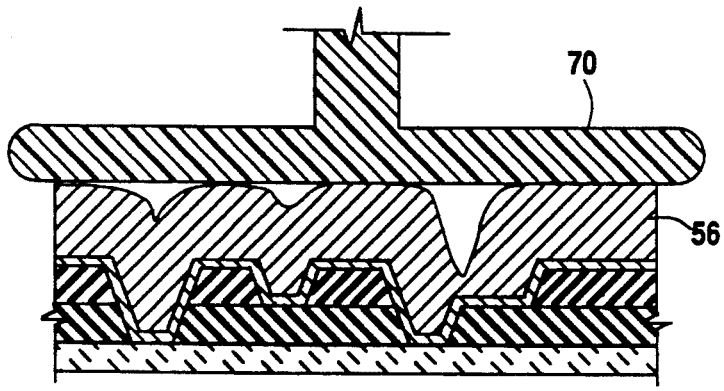

In FIG. 11, the top surface of substrate 10 is contacted by a rotating polishing pad 70 in the presence of a slurry (not shown). By way of example, a hard blown polyurethane pad may be used with sodium chlorite at 120° F. for 10 minutes. The polishing should not locally conform to the unevenness in copper 56. Instead, pad 70 should shave off the peaks of copper 56 with little or no removal of material elsewhere. Generally speaking, the planarization can be performed by mechanical polishing, mechanical/chemical polishing, or electropolishing and the like. Mechanical polishing and mechanical/chemical polishing of polyimide are well known in the art and will not be detailed herein. See, for instance, U.S. Pat. No. 4,944,836 to Beyer et al. Electropolishing is also known in the art, for instance as disclosed by R. J. Contolini et al. in "Embedded Conductors by Electrochemical Planarization", Abstract No. 184, *Abstracts From the Spring Electrochemical Society Meeting*, Los Angeles, Calif., May 7, 1989 which discusses a process for producing planarized multilayer interconnects incorporating vertical-walled conductors that is applicable to any metal that can be electroplated and electropolished, such as copper and gold. See also C. W. Koburger, "Trench Planarization Technique", *IBM Technical Disclosure Bulletin*, Vol. 27, No. 6, pp. 3242-3243 (November, 1984) in which a non-selective etch is used to etch a trench structure just past the original surface, resulting in a surface that is neither roughened nor otherwise degraded by the etch.

Figure 12:
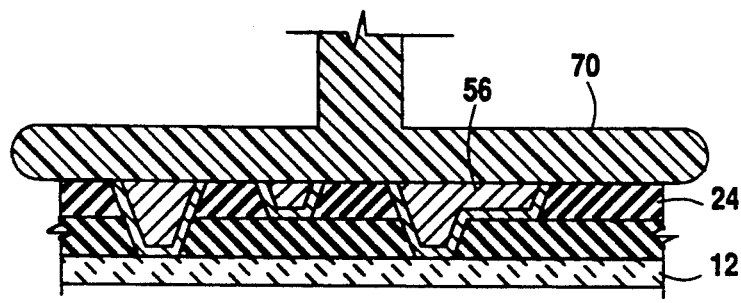

In FIG. 12, polishing pad 70 and substrate 10 are moved toward one another. Pad 70 contacts copper 56 and planarly removes copper 56 and seed layer 50 until contact is made with the top surface of second insulating layer 24 (or, equivalently, insulating layer 40 which comprises second insulating layer 24 on first insulating layer 14). This removes seed layer 50 and copper 56 from any regions outside the channel and the via.

Figure 13:
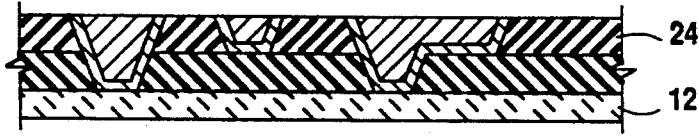

In FIG. 13, polishing pad 70 is retracted relative to the substrate and any attendant slurry on the substrate is cleaned off. The polishing can be discontinued a fixed time after polyimide 24 is exposed so only a negligible amount of polyimide will be removed. An in situ conductivity monitoring technique for chemical/mechanical planarization endpoint detection is disclosed in U.S. Pat. No. 4,793,895 by Kaanta et al. Optionally, a brief plasma etch-back (not shown) of the polished, planarized polyimide surface may be applied to provide roughening and thereby improve adhesion to subsequently deposited materials. In any event, the top surface of substrate 10 is substantially smooth and an electrically conductive horizontal channel is interconnected to an electrically conductive vertical via in the insulating layer of the substrate.

Figure 14:
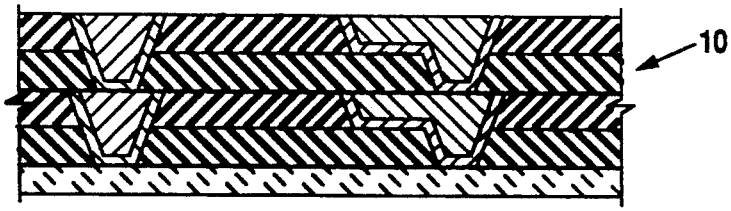

With reference now to FIG. 14, substrate 10 can be fabricated into a multilayer electrical interconnect with stacked vias and a plurality of channels and vias by repeating the previously described steps.

Figure 15:
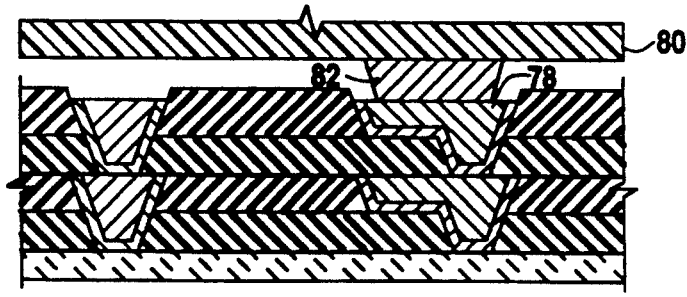

Furthermore, as seen in FIG. 15, if desired, copper 78 can be etched-back a slight distance to provide registration for an electrical component shown as integrated circuit chip 80 containing conductive bumps 82.

SECOND EMBODIMENT

FIGS. 16-23 show a second embodiment of the present invention for forming a conductive channel and via in the insulating layer of a substrate in which any description for the previous embodiment is incorporated herein insofar as the same is applicable, and the same description is not repeated.

In FIG. 16, substrate 90 comprises a base 92. A first mask shown as photoresist 94 is deposited on base 92. Photoresist 94 is patterned to contain opening 96 which exposes portion 98 of base 92 outside the via. That is, photoresist 94 is patterned to occupy only the via.

In FIG. 17, a first insulating layer shown as silicon-dioxide 100 is deposited, for example by Chemical vapor deposition, on photoresist 94 and base portion 98.

In FIG. 18, the first mask and any of the first insulating layer thereon are removed from the substrate. This "liftoff step" can be performed in several ways. Two possible approaches are shown in FIGS. 18a–18b and FIGS. 18c–18d, respectively. Referring to FIG. 18a, the top surface of substrate 90 can be planarized by applying a rotating polishing pad 100 in the presence of a slurry until the top surface is smooth and comprises photoresist 94, and silicon-dioxide 100 in photoresist opening 96. Thereafter, in FIG. 18b, photoresist 94 is removed. A wet chemical etch may be used. A dry etch can also be used and may be best suited for a etching a high temperature deposited mask and/or leaving a clean surface. After the etching occurs, the silicon-dioxde 100 remaining on base 92 has a substantially planar top surface and an opening 102 at the via. An alternative approach, as seen in FIG. 18c, applies a brief wet chemical etch to completely etch the deposited silicon-dioxide 100 from the sidewalls 104 of photoresist 94 while removing only a small portion (shown by broken lines 105) of silicon dioxide 100 from mask opening 96. This can be achieved if the chemical vapor deposition (or other deposition process) preferentially deposits more of first insulating layer on the horizontal surfaces than on the vertical surfaces of the substrate. When this happens, a brief wet chemical etch clears the first insulating layer from the sidewalls of the first mask before it is cleared from the top planar surface of the first mask. Thereafter, as shown in FIG. 18d, the exposed sidewalls 104 of photoresist 94 allow photoresist 94 to be removed by a wet chemical etch or an isotropic dry etch without damaging the silicon-dioxide. Thus, the silicon-dioxde 100 remaining on base 92 has a substantially planar top surface and an opening 102 at the via.

In FIG. 19, a second mask is deposited on the first insulating layer and the exposed portion of the base such that the second mask has an opening which defines the region outside the channel and the via while exposing a portion of the first insulating layer. As may be seen, photoresist layer 106 is deposited on silicon-dioxide 100 and base portion 92 beneath the via. Photoresist 106 is then patterned to form opening 108 which exposes portion 110 of silicon-dioxide 100 outside the channel and the via. In effect, photoresist 106 is patterned to remain in the channel and the via.

In FIG. 20, a second insulating layer shown as layer of silicon-dioxide 108 is deposited, for example by chemical vapor deposition, on photoresist 106 and exposed silicon-dioxide portion 110.

In FIG. 21, the second mask and any of the second insulating layer thereon is removed from the substrate. This "liftoff step" can be performed as described in FIGS. 18a–18b or FIGS. 18c–18d for the first mask. As a result, all photoresist 106 is removed from the substrate and the silicon-dioxde 108 remaining on silicon-dioxide 100 has a substantially planar top surface with an opening at the channel and the via. As may be seen, silicon-dioxide layers 100 and 108 form an insulating layer 114 on base 92. Layer 114 includes a horizontal channel 116 and, adjacent to the channel, a vertical via 118.

Figure 18A:
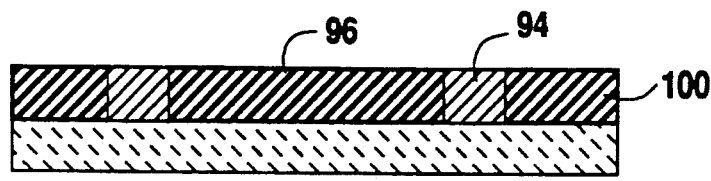
Figure 18B:
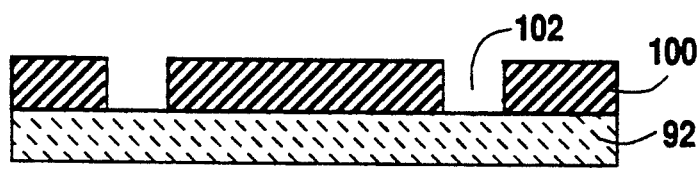
Figure 18C:
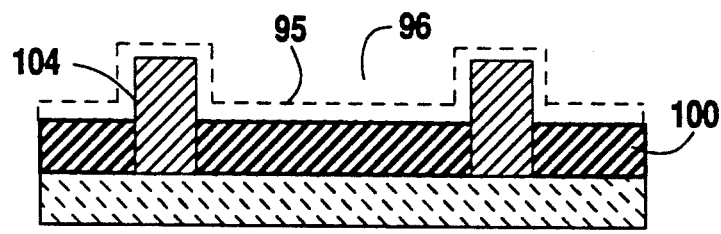
Figure 18D:
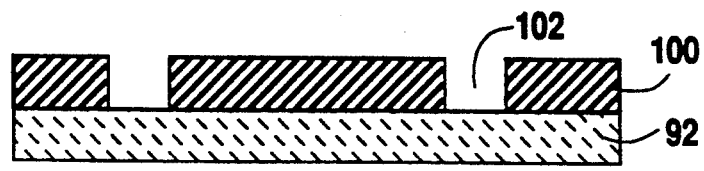

Alternatively, if desired, the polishing step in FIG. 18a can be performed while skipping the removal step in FIG. 18b. In this case, photoresist 94 would remain in the via and form a planar top surface with silicon-dioxide 100.

Thereafter, in the removal step in FIG. 21, after photoresist 106 is removed all photoresist 94 in the via would also be removed.

In FIG. 22, copper 120 is deposited in channel 116 and via 118, and in FIG. 23 the top of substrate 90 is planarized.

THIRD EMBODIMENT

FIGS. 24-29 show a third embodiment of the present invention for forming an integrated capacitor in the insulating layer of a substrate in which any description for previous embodiments is incorporated herein insofar as the same is applicable, and the same description is not repeated.

Figure 24:
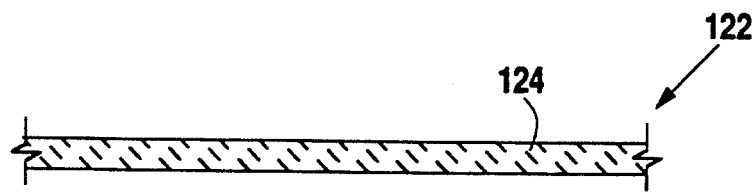
FIGS. 24–28 and 25A–25D are cross-sectional views detailing a method of forming an integrated capacitor in the insulating layer of a substrate in accordance with a third embodiment of the present invention.

In FIG. 24, a substrate 122 includes an electrically conductive base 124.

Figure 25:
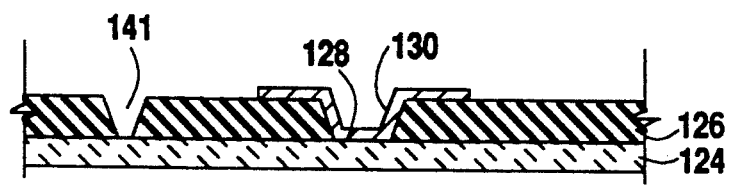
Figure 25A:
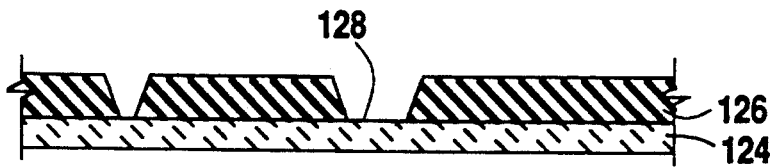
Figure 25B:
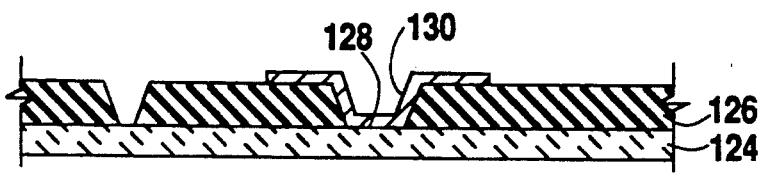
Figure 25C:
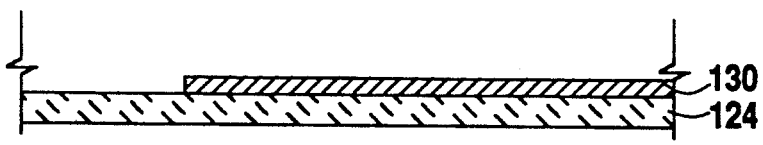
Figure 25D:
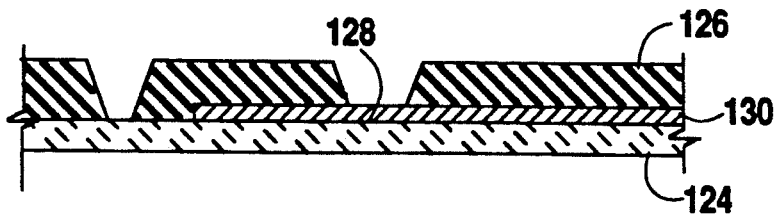

In FIG. 25, a first insulating layer shown as polyimide 126 is formed on base 124. Polyimide 126 has an opening at the via, and base portion 128 lies directly beneath the via. Base portion 128, however, is not exposed. A thin dielectric layer, such as 500-1000 angstroms silicon-dioxide, is deposited on and covers base portion 128. Suitable methods of deposition include chemical vapor deposition, sputtering and evaporation. Dielectric 130 can also be silicon-nitride, tantalum-pentoxide, barium-titanate or another material with a high dielectric constant. Dielectric 130 can be fabricated on base portion 128 in several ways. Two possible ways are shown in FIGS. 25a-25b, and in FIGS. 25c-25d, respectively. Referring to FIG. 25a, a first insulating layer shown as polyimide 126 is formed on base 124 with an opening at the via, thereby exposing base portion 128. In FIG. 25b, dielectric 130 is deposited on polyimide 126 and base portion 128. In an alternative approach, FIG. 25c shows a layer of dielectric 130 deposited on base portion 128 before placing the first insulating layer on the base. In FIG. 25d, polyimide 126 is formed on base 124 and dielectric 130, and contains an opening at the via. Dielectric 130 continues to cover base portion 128.

Figure 26:
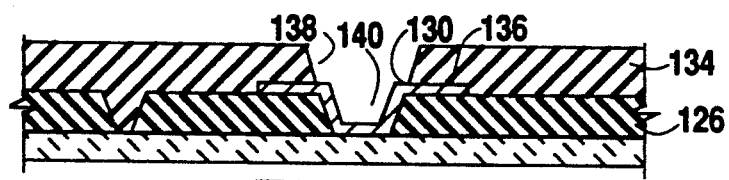

Thereafter, in FIG. 26, a second insulating layer seen as polyimide 134 is formed on polyimide layer 126 and portions 136 of dielectric 130 outside channel 138 and via 140. A separate via 141 is also formed.

Figure 27:
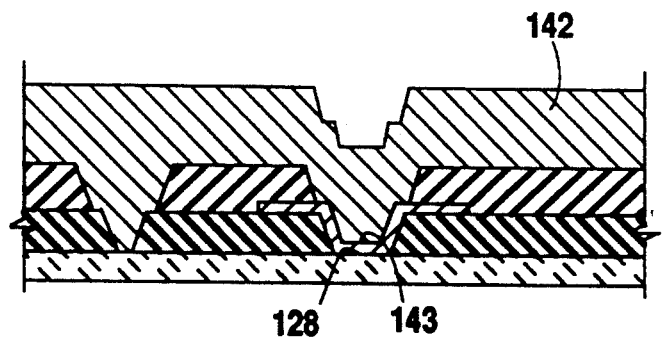

In FIG. 27, copper 142 is deposited channel 138, via 140 and via 141. Copper 142 is also deposited on dielectric portion 143 which covers previously exposed base portion 128. Obviously, dielectric 130 and polyimide 126 must prevent copper 142 from directly contacting base 124 to prevent a short-circuit in the capacitor.

Figure 28:
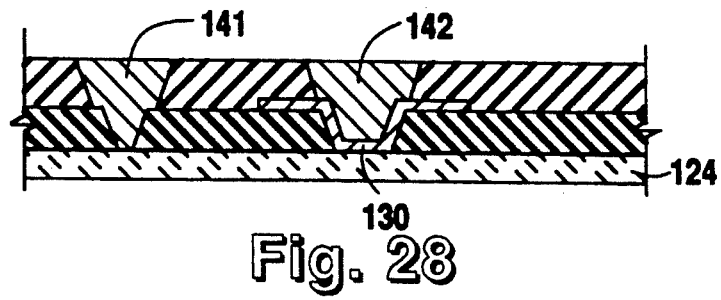

Finally, in FIG. 28 the top of substrate 122 is planarized. As a result, base 124 (and copper 142 in via 141), dielectric 130, and copper 142 in channel 138 and via 140 form the first electrode, dielectric, and second electrode, respectively, of an integrated capacitor in and integral to substrate 122.

FOURTH EMBODIMENT

FIGS. 29-33 show a fourth embodiment of the present invention for forming an optical waveguide in the insulating layer of a substrate in which any description for the previous embodiments is incorporated herein insofar as the same is applicable, and the same description is not repeated.

Figure 29:
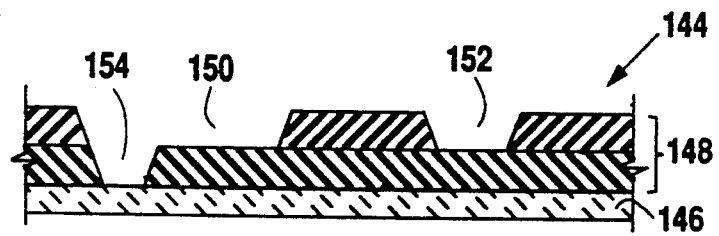
FIGS. 29–33 are cross-sectional views detailing a method of forming an optical waveguide in the insulating layer of a substrate in accordance with a fourth embodiment of the present invention.

As seen in FIG. 29, a substrate 144 comprises a base 146 beneath an insulating layer 148, and layer 148 contains channels 150 and 152 and via 154 adjacent to channel 150.

Figure 30:
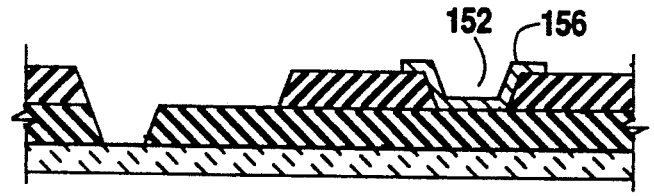

In FIG. 30, a cladding material 156 is deposited or lined on the walls of channel 152. Cladding material 156 can be silicon-dioxide, silicon-nitride, or a low index polymer.

Figure 31:
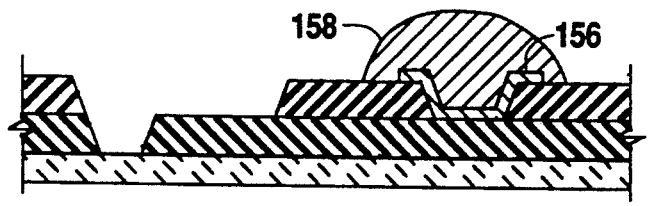

In FIG. 31, an optical conductor 158 is deposited into channel 152 and onto cladding material 156. Optical conductor 158 and cladding material 156 are chosen so that optical conductor 158 has a sufficiently different index of refraction relative to cladding material 156 that optical conductor 158 forms an optical waveguide. Suitable optical conductors include polymethyl-methacrylate (PMMA), polymers such as polyimide, and glasses. For instance, a glass optical conductor 158 may be used with a silicon-dioxide cladding material 156. The thickness of cladding material 156 must be great enough to contain the evanescent mode of the optical energy.

Figure 32:
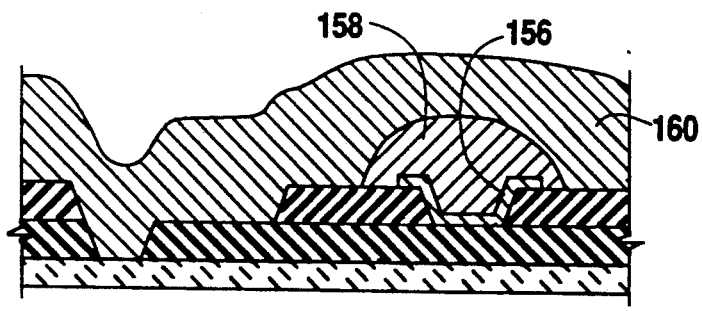

In FIG. 32, an electrical conductor shown as copper 160 is deposited on substrate 144, fills channel 150 and via 154, and covers insulating layer 148 and optical conductor 158.

Figure 33:
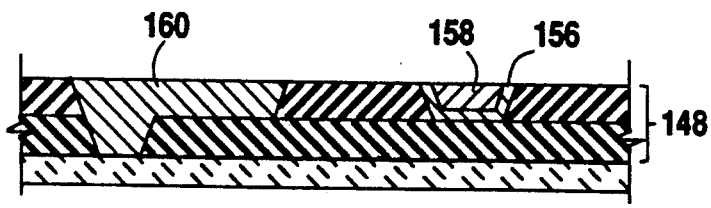

Finally, in FIG. 33 the top of substrate 144 is planarized so that any cladding material 156, optical conductor 158 and copper 160 above the insulating layer 148 is removed.

As should be clear, many variations of the above-mentioned embodiments would be readily apparent to one having skill in the art. For example, combinations of conductive channels, conductive vias, integrated capacitors and/or optical waveguides can be fabricated in various insulating layers of a substrate. Many trenching techniques, including the first and second embodiments h and the embodiments disclosed in U.S. Pat. No. 5,091,339 to Carey are suitable for forming the channels and vias for the integrated capacitor and optical waveguide described herein. Additionally, numerous electrical conductors besides copper are suitable. The steps in FIGS. 1-4 or FIGS. 14-18 can be used to form a via in an insulating layer regardless of the processing steps which follow. Moreover, the first insulating layer could be formed in accordance with the first embodiment (FIGS. 1-4) and the second insulating layer could be formed in accordance with the second embodiment (FIGS. 19-21). Likewise, the first insulating layer could be formed in accordance with the second embodiment (FIGS. 14-18) and the second insulating layer could be formed in accordance with the first embodiment (FIGS. 5-8).

The present invention, therefore, is well adapted to carry out the objects and attain the ends and advantages mentioned, as well as others inherent therein. While presently preferred embodiments of the invention have been described for the purpose of disclosure, numerous changes in the details of construction, and steps of the process, will be readily apparent to those skilled in the art and which are encompassed within the spirit of the present invention and the scope of the appended claims.

What is claimed is:

1. A method for fabricating a channel and via in the insulating layer of a substrate
   so as to provide an insulating layer on a base with a horizontal channel in the top surface of and partially through the thickness of the insulating layer, and adjacent to the channel a vertical via in the top surface of and completely through the thickness of the insulating layer, comprising the steps of:
   depositing a first mask on a base wherein the first mask contains an opening which defines the region outside the via and exposes a portion of the base,
   depositing a first insulating layer on the first mask and the exposed portion of the base,
   removing the first mask and any of the first insulating layer thereon from the substrate, thereby removing the portion of the first insulating layer in the via and exposing the portion of the base beneath the via,
   depositing a second mask on the first insulating layer and the exposed portion of the base beneath the via wherein the second mask contains an opening which defines the region outside the channel and the via and exposes a portion of the first insulating layer, depositing a second insulating layer on the second mask and the exposed portion of the first insulating layer, and removing the second mask and any of the second insulating layer thereon from the substrate, thereby removing the portion of the second insulating layer in the channel and the via, exposing the portion of the first insulating layer beneath the channel and exposing and the previously exposed portion of the base beneath the via.

2. The method of claim 1 wherein at least one of the first and second masks is deposited as a layer and then patterned, and is selected from the group consisting of photoresist, silicon-dioxide, silicon-nitrides and metals.

3. The method of claim 1 wherein at least one of the first and second insulating layers is selected from the group consisting of polymers, silicon-dioxide, nitrides, oxynitrides, spin on glasses, and solgels.

4. The method of claim 1 wherein at least one of the first and second masks is removed by a dry etch.

5. The method of claim 1 wherein at least one of the first and second masks is removed by wet chemical etching.

6. The method of claim 1 wherein at least one of the steps of removing the first mask and removing the second mask further includes, planarizing the top surface of the substrate until said top surface is smooth and comprises the mask and the insulating layer in the opening in the mask, and then removing the mask from the substrate.

7. The method of claim 6 wherein said planarizing the top surface of the substrate is performed by applying a rotating polishing pad in the presence of a slurry.

8. The method of claim 1 wherein at least one of the steps of removing the first mask and removing the second mask further includes, removing the insulating layer from the sidewalls of the mask without removing all the insulating layer from the opening in the mask, and removing the mask from the substrate.

9. The method of claim 8 wherein the insulating layer is removed from the sidewalls by a dry etch.

10. The method of claim 8 wherein the insulating layer is removed from the sidewalls by a wet chemical etch.

11. The method of claim 1 wherein the thickness of the first insulating layer defines the distance from the bottom of the channel to the base, the thickness of the second insulating layer defines the depth of the channel, and the combined thickness of the first and second insulating layers defines the depth of the via.

12. A method for fabricating a via in the insulating layer of a substrate, comprising the steps of:

depositing a mask on a base of the substrate wherein the mask contains an opening which defines the region outside the via and exposes a portion of the base;

depositing an insulating layer on the mask and the exposed portion of the base; and removing the mask and any of the insulating layer thereon from the substrate, thereby removing the portion of the insulating layer in the via and exposing the portion of the base beneath the via.

13. A method for fabricating a channel and via in the insulating layer of a substrate so as to provide an insulating layer on a base with a horizontal channel in the top surface of and partially through the thickness of the insulating layer, and adjacent to the channel a vertical via in the top surface of and completely through the thickness of the insulating layer comprising the steps of:

depositing a first insulating layer on the base;

providing a first mask over the first insulating layer wherein the first mask defines the via and exposes a portion of the first insulating layer, removing the portion of the first insulating layer in the via, thereby exposing the portion of the base beneath the via, removing the first mask from the first insulating layer, depositing a second mask on the first insulating layer and the exposed portion of the base beneath the via wherein the second mask contains an opening which defines the region outside the channel and the via and exposes a portion of the first insulating layer, depositing a second insulating layer on the second mask and the exposed portion of the first insulating layer, and removing the second mask and any of the second insulating layer thereon from the substrate, thereby removing the portion of the second insulating layer in the channel and the via, exposing the portion of the first insulating layer beneath the channel and exposing and the previously exposed portion of the base beneath the via.

14. A method for fabricating a channel and via in the insulating layer of a substrate so as to provide an insulating layer on a base with a horizontal channel in the top surface of and partially through the thickness of the insulating layer, and adjacent to the channel a vertical via in the top surface of and completely through the thickness of the insulating layer, comprising the steps of:

depositing a first mask on a base wherein the first mask contains an opening which defines the region outside the via and exposes a portion of the base, depositing a first insulating layer on the fist mask and the exposed portion of the base, removing the first mask and any of the first insulating layer thereon from the substrate, thereby removing the portion of the first insulating layer in the via and exposing the portion of the base beneath the via, depositing a second insulating a layer on the first insulating layer and the exposed portion of the base, providing a second mask over the second insulating layer wherein the second mask defines the channel and the via and exposes a portion of the second insulating layer, removing the portion of the second insulating layer in the channel and the via, thereby exposing the portion of the first insulating layer beneath the channel and the previously exposed portion of the base beneath the via, and removing the second mask from the second insulating layer.

15. The method of claims 1, 13, 14, further comprising the step of:

depositing an electrical conductor into the channel and via.

16. The method of claim 15 wherein the electrical conductor is copper.

17. The method of claim 15, further comprising the step of:
   planarizing the top surface of the substrate so that the electrical conductor remains only in the channel and via and is otherwise removed from the top surface of the substrate, thereby forming an electrically conductive horizontal channel interconnected to an electrically conductive vertical via in the insulating layer of the substrate.

18. The method of claim 17 wherein the planarization of the substrate is performed by applying a rotating polishing pad in the presence of a slurry.

19. The method of claim 12 wherein the mask is deposited as a layer and then patterned, and is selected from the group consisting of photoresist, silicon-dioxide, silicon-nitrides and metals.

20. The method of claim 12 wherein the insulating layer is selected from the group consisting of polymers, silicon-dioxide, nitrides, oxynitrides, spin on glasses, and solgels.

21. The method of claim 12 wherein the mask is removed by a dry etch.

22. The method of claim 12 wherein the mask is removed by a wet chemical etching.

23. The method of claim 12, wherein the step of removing the mask further includes,
   planarizing the top surface of the substrate until said top surface is smooth and comprises the mask and the insulating layer in the opening in the mask, and then
   removing the mask from the substrate.

24. The method of claim 23 wherein said planarizing the top surface of the substrate is performed by applying a rotating polishing pad in the presence of a slurry.

25. The method of claim 12 wherein the step of removing the mask further includes,
   removing the insulating layer from the sidewalls of the mask without removing all the insulating layer from the opening in the mask, and
   removing the mask from the substrate.

26. The method of claim 25 wherein the insulating layer is removed from the sidewalls by a dry etch.

27. The method of claim 25 wherein the insulating layer is removed from the sidewalls by a wet chemical etch.

28. The method of claim 12, further comprising the step of:
   depositing an electrical conductor into the via.

29. The method of claim 28, further comprising the step of:
   planarizing the top surface of the substrate so that the electrical conductor remains only in the via and is otherwise removed from the top surface of the substrate, thereby forming an electrically conductive vertical via in the insulating layer of the substrate.

30. The method of claim 29 wherein the planarization of the substrate is performed by applying a rotating polishing pad in the presence of a slurry.

31. The method of claim 13 wherein the exposed portion of the first insulating layer is removed by a wet chemical etch.

32. The method of claim 14 wherein the exposed portion of the second insulating layer is removed by a wet chemical etch.

33. The method of claim 32 wherein the wet chemical etch does not remove the first insulating layer.

* * * * *